(12) United States Patent
Chiu et al.

(10) Patent No.: US 7,417,856 B2
(45) Date of Patent: Aug. 26, 2008

(54) HEAT DISSIPATION MODULE AND FLOW DIRECTION CONTROLLING STRUCTURE THEREOF

(75) Inventors: Yung-Yu Chiu, Taoyuan Hsien (TW); Kuo-Cheng Lin, Taoyuan Hsien (TW); Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/246,085

(22) Filed: Oct. 11, 2005

(65) Prior Publication Data

US 2006/0081366 A1    Apr. 20, 2006

(30) Foreign Application Priority Data

Oct. 15, 2004    (TW) ............................... 93131271 A (51) Int. Cl.
H05K 7/20     (2006.01)
F24F 13/06    (2006.01)
F28D 15/00    (2006.01)
H05K 5/00     (2006.01)

(52) U.S. Cl. .................... 361/695; 361/694; 415/211.2; 454/347

(58) Field of Classification Search .............. 415/211.2, 415/146; 361/694–695; 165/80.3, 104.33; 416/247 R; 454/347
See application file for complete search history.

(56) References Cited

U.S. PATENT DOCUMENTS 4,648,007 A * 3/1987 Garner ........................ 361/695
6,108,203 A * 8/2000 Dittus et al. ................. 361/695
6,936,767 B2 * 8/2005 Kleinecke et al. ............. 174/50
7,018,169 B2 * 3/2006 Phillip et al. .................. 415/60
7,128,526 B2 * 10/2006 Paulsen ....................... 415/146

FOREIGN PATENT DOCUMENTS

JP    2004112899 A  *  4/2004
SU    802628 B      *  2/1981

OTHER PUBLICATIONS

Wenzel, Dual FAn N+1 Enclosure, Feb. 1993, IBM TechnicalDisclosure Bulletin, vol. 36, No. 02, pp. 315-316.*

* cited by examiner

*Primary Examiner*—Jayprakash N Gandhi
*Assistant Examiner*—Robert J Hoffberg
(74) *Attorney, Agent, or Firm*—Birch, Stewart, Kolasch & Birch, LLP (57) ABSTRACT

A heat dissipation module is disclosed. A first heat dissipation apparatus and a second heat dissipation apparatus are symmetrically disposed. A flow direction controlling structure has a rotatable element disposed between the first and second heat dissipation apparatuses and formed an isolation wall thereof, so that the first and second heat dissipation apparatuses respectively have a tunnel. Each of the rotatable elements has a fixed end and a correspondingly movable end for guiding air flow. When outlet pressures of the first and second heat dissipation apparatuses are different, the movable end deflects to the first heat dissipation apparatus or the second heat dissipation apparatus to change outlet areas thereof. The heat dissipation module and the flow direction controlling structure control air flow and prevent backflow, so as to maintain overall outlet area and improve heat dissipation effect of the module.

20 Claims, 8 Drawing Sheets

HEAT DISSIPATION MODULE AND FLOW DIRECTION CONTROLLING STRUCTURE THEREOF

This Non-provisional application claims priority under U.S.C. § 119(a) on Patent Application No(s). 093131271 filed in Taiwan, Republic of China on Oct. 15, 2004, the entire contents of which are hereby incorporated by reference.

BACKGROUND OF THE INVENTION

1. Field of the Invention

The invention relates to a heat dissipation module and a flow direction controlling structure thereof, and particularly to a heat dissipation module with a flow direction controlling structure capable of controlling air flow and preventing outside air flow entering the heat dissipation module.

2. Brief Discussion of the Related Art

As efficiency of electronic devices increases rapidly, heat dissipation apparatuses have become essential elements thereof. Heat generated by the electronic devices, if not properly dissipated, can lead to decreased efficiency or even burn-out of the electronic devices. Particularly, heat dissipation apparatuses are critical to micro-electrical elements, such as integrated circuits (ICs). As integration increases and package technology improves, size of the ICs is reduced, and heat accumulated in the unit area thereof increases. As a result, heat dissipation apparatuses with high efficiency are a major area of development.

Generally, ventilation, convection or heat dissipation in a heat generating system such as a server, a computer, an electronic mechanism or a power supply is facilitated by a heat dissipation apparatus, such as an axial flow fan, or a centrifugal fan. The heat dissipation apparatus can guide air flow to dissipate heat generated by the electronic devices to the environment for performing heat dissipation or air convection.

Figure 1A:
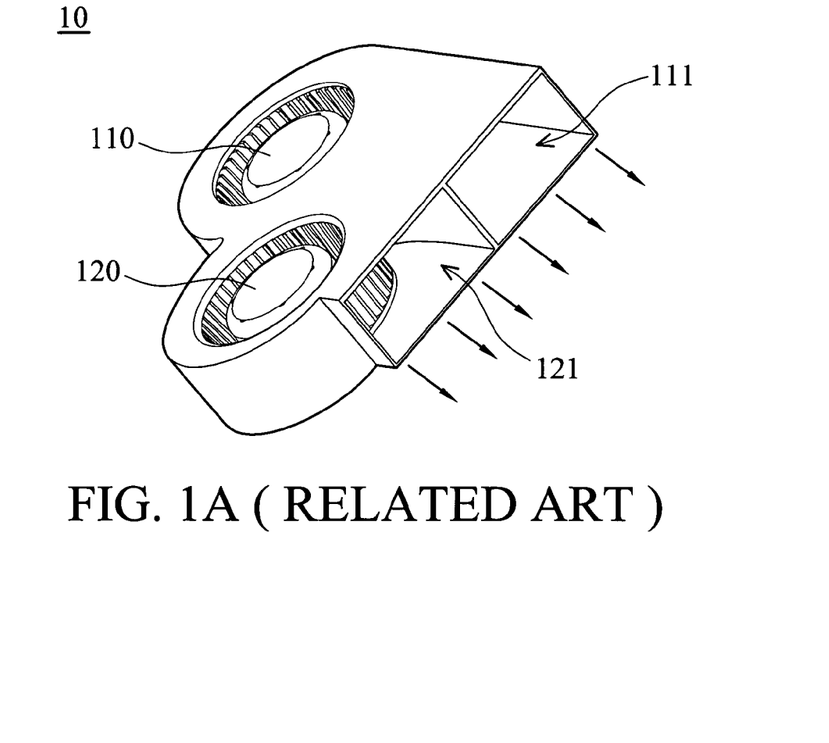
FIG. 1A is a schematic view of a conventional parallel fan module.

FIG. 1A illustrates a conventional parallel fan module. The conventional parallel fan module 10 includes a first blower 110 and a second blower 120 for discharging air inside the first blower 110 and the second blower 120 to be respectively vented through the outlet 111 and the outlet 121.

When the first blower 110 and the second blower 120 are in operation, the first blower 110 and the second blower 120 discharge the air through the outlet 111 and the outlet 121, respectively. However, the blowers 110 and/or 120 may has glitch or malfunction. When one of the blowers 110 and 120 malfunctions, for example, the second blower 120 malfunctions, only the first blower 110 is in operation, and the air inside the first blower 110 is still able to be discharged through the outlet 111. The outlet 121 of the second blower 120 is wide opens to the environment, which may lead to backflow and air accumulation in the second blower 120. In this case, the first blower 110 may be affected by the backflow to reduce heat dissipation efficiency of the entirety of the parallel fan module 10.

Conventionally, a compensation mechanism is provided to increase power of the blower in operation. With the compensation mechanism, power of the blower in operation is increased to compensate for the malfunctioning blower such that forced convection occurs in the second blower 120 to discharge the fluid accumulated in the first blower 110 and the second blower 120. The compensation mechanism, however, increases cost and complexity of the structure, and does not provide real-time compensation since reaction time is required to implement compensation from the time when one of the blowers is detected as malfunction. Further, backflow is not completely prevented since the outlet 121 remains open to the environment.

Figure 1B:
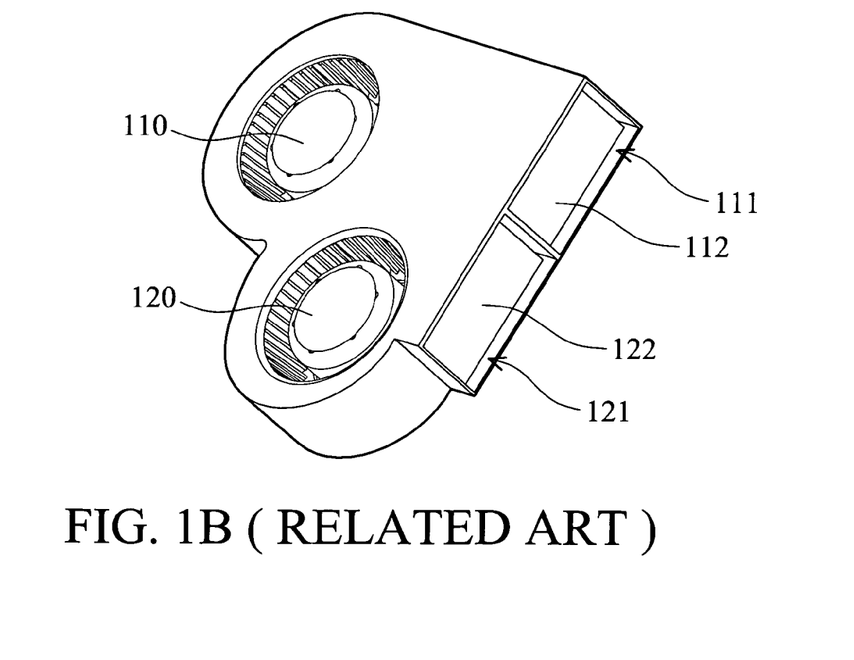
FIG. 1B is a schematic view of a conventional parallel fan module with flappers, in which two blowers are not in operation.
Figure 1C:
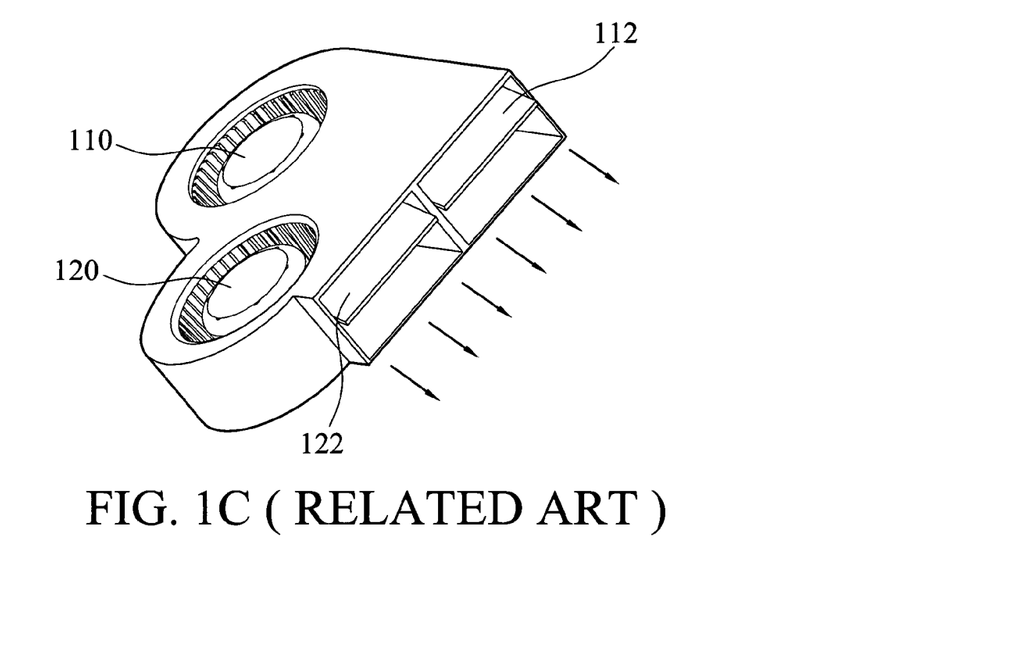
FIG. 1C is a schematic view or the conventional parallel fan module with flappers, in which two blowers are in operation.
Figure 1D:
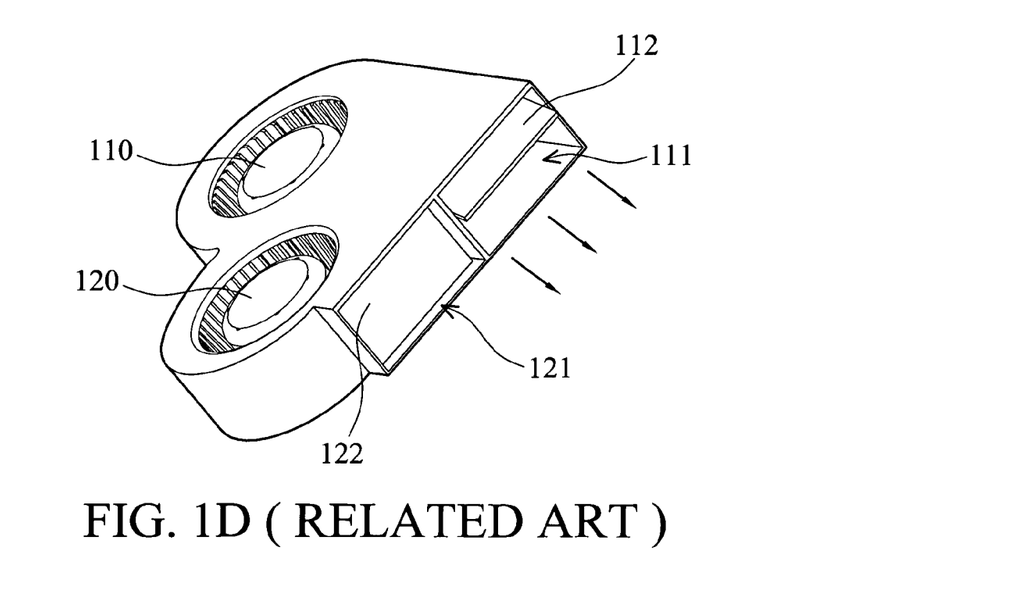
FIG. 1D is a schematic view of the conventional parallel fan module with flappers, in which one of the blowers malfunctions.

In another conventional solution, a plurality of flappers is provided at the outlets to prevent from the backflow. An example is shown in FIG. 1B, FIG. 1C and FIG. 1D. FIG. 1B illustrates a conventional parallel fan module with flappers, in which the blowers are not in operation. FIG. 1C illustrates the conventional parallel fan module with flappers in operation. FIG. 1D illustrates the conventional parallel fan module with flappers in which one of the blowers malfunctions. In the conventional parallel fan module 10, a flapper 112 is installed at the outlet 111 of the first blower 110, and a flapper 122 is installed at the outlet 121 of the second blower 120. When the first blower 110 and the second blower 120 are not in operation, the flappers 112 and 122 are in a closed position, as shown in FIG. 1B, by gravity or other specific design (such as a biased device) to seal the outlet 111 and the outlet 112.

When the first blower 110 and the second blower 120 are in operation, the air within the first blower 110 and the second blower 120 is respectively discharged through the outlet 111 and the outlet 121, generating a flow force to the flappers 112 and 122 such that the flappers 112 and 122 move to an open position as shown in FIG. 1C.

When one of the blowers, such as the second blower 120, malfunctions, only the first blower 110 is in operation as shown in FIG. 1D. In this case, the flapper 112 at the outlet 111 is moved to the open position by the flow force, but the flapper 122 at the outlet 121 maintains in the closed position since no flow force is generated in the second blower 120. Thus, the outlet 121 of the second blower 120 is sealed such that fluid in the environment does not backflow to the malfunctioning second blower 120, preventing hot air accumulation and reduction in heat dissipation efficiency.

The flappers, however, are respectively disposed at the blowers. When one blower in the heat dissipation module malfunctions, the outlet of the malfunctioned blower is sealed by the flapper thereof to prevent backflow. Thus, there is no heat dissipation to the heat source corresponding to the sealed outlet, which leads to heat accumulation at the heat source and reduction of heat dissipation efficiency. Further, the whole outlet area of the heat dissipation module is reduced. In the conventional parallel fan module in FIG. 1D, for example, the original whole outlet area, including the outlet 111 and the outlet 121, is reduced to be half one when the flapper 122 seals the outlet 121, which seriously deteriorates heat dissipation effect.

SUMMARY OF THE INVENTION

Accordingly, to solve the above-mentioned problem, the present invention discloses a heat dissipation module and a flow direction controlling structure thereof to control air flow and maintain overall outlet scope.

A flow direction controlling structure for a heat dissipation module is disclosed. The heat dissipation module includes a first heat dissipation apparatus and a second heat dissipation apparatus. The flow direction controlling structure includes a rotatable element disposed between the first heat dissipation apparatus and the second heat dissipation apparatus. The rotatable element includes a fixed end and a correspondingly movable end and acts as an isolation wall between the first heat dissipation apparatus and the second heat dissipation apparatus, so that the first heat dissipation apparatus and the second heat dissipation apparatus respectively have a tunnel. When outlet pressure of the first heat dissipation apparatus and the second heat dissipation apparatus are different, the movable end of the rotatable element deflects to the first heat dissipation apparatus or the second heat dissipation apparatus to seal either the outlet of the first heat dissipation apparatus or the outlet of the second heat dissipation apparatus.

The flow direction controlling structure further includes a limiting element and a flapping element. When the first heat dissipation apparatus and the second heat dissipation apparatus are in operation, the limiting element can limit the movable end of the rotatable element from deflecting to the first heat dissipation apparatus or the second heat dissipation apparatus. The flapping element can be disposed at an outlet of the first heat dissipation apparatus or the second heat dissipation apparatus to seal the first heat dissipation apparatus or the second heat dissipation apparatus together with the rotatable element.

Another heat dissipation module includes a first heat dissipation apparatus, a second heat dissipation apparatus, and a flow direction controlling structure. The first heat dissipation apparatus and the second heat dissipation apparatus are symmetrically disposed. The flow direction controlling structure includes a rotatable element disposed between the first heat dissipation apparatus and the second heat dissipation apparatus, and the rotatable element acts as an isolation wall between the first heat dissipation apparatus and the second heat dissipation apparatus, so that the first heat dissipation apparatus and the second heat dissipation apparatus respectively have a tunnel. The rotatable element includes a fixed end and a correspondingly movable end. When outlet pressure of the first heat dissipation apparatus and the second heat dissipation apparatus are different, the movable end of the rotatable element deflects to the first heat dissipation apparatus or the second heat dissipation apparatus to change outlet areas of the first heat dissipation apparatus and the second heat dissipation apparatus. That is, the movable end of the rotatable element deflects to seal either the outlet of the first heat dissipation apparatus or the outlet of the second heat dissipation apparatus. The flow direction controlling structure can further include a limiting element and a flapping element. When the first heat dissipation apparatus and the second heat dissipation apparatus are in operation, the limiting element can limit the movable end of the rotatable element from deflecting to the first heat dissipation apparatus or the second heat dissipation apparatus. The flapping element can be disposed at an outlet of the first heat dissipation apparatus or the second heat dissipation apparatus to seal the first heat dissipation apparatus or the second heat dissipation apparatus together with the rotatable element.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the subsequent detailed description and the accompanying drawings, which are given by way of illustration only, and thus are not limitative of the present invention, and wherein.

DETAILED DESCRIPTION OF THE PREFERRED EMBODIMENTS

Figure 2A:
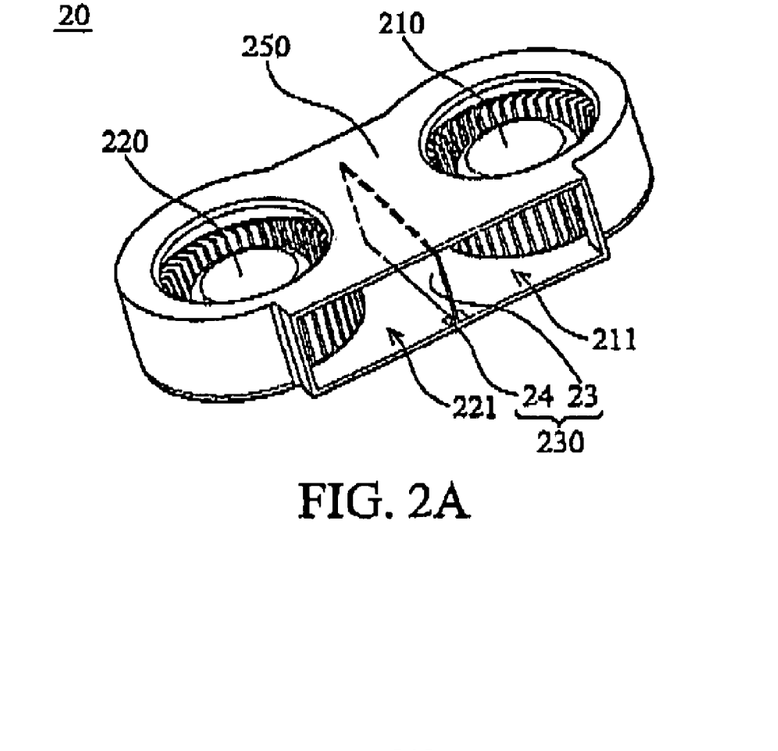
FIG. 2A is a schematic view of a heat dissipation module of an embodiment of the present invention.

FIG. 2A is a schematic view of a heat dissipation module of an embodiment of the present invention. The heat dissipation module 20 in the embodiment includes a housing 250, a first impellar 210, a second impeller 220, and a flow direction controlling structure 230, wherein both of the first impeller 210 and the second impeller 220 are disposed within the housing 250. The heat dissipation module 20 is a preferred parallel fan module, which includes two or more parallel fans. The first heat dissipation apparatus 210 and the second heat dissipation apparatus 220 are symmetrically disposed, and can be two axial flow fans or blowers. Air in the first heat dissipation apparatus 210 and the second heat dissipation apparatus 220 can be respectively discharged through the outlet 211 and the outlet 221 when the first heat dissipation apparatus 210 and the second heat dissipation apparatus 220 are in operation.

The flow direction controlling structure 230 is modularly formed and detachably attached in one or more positions between the two heat dissipation apparatuses. The flow direction controlling structure 230 can be disposed at the inlet or the outlet of the heat dissipation module. In the embodiment, the flow direction controlling structure 230 is preferably disposed near the outlet.

The flow direction controlling structure 230 includes a rotatable element 23, such as a flapper, disposed within the housing 250 and between the first impeller 210 and the second impeller 220. Also, the rotatable element 23 acts as an isolation wall between the first impeller 210 and the second impeller 220 so as to divide the outlet into a first outlet 211 and a second outlet 221, and the first impeller 210 and the second impeller 220 respectively have a tunnel, i.e., the first outlet 211 and the second outlet 221. The rotatable element 23 can be disposed in one or more positions of the heat dissipation apparatus 210 by axial disposal, coaxial disposal, modular disposal, direct disposal on axis, engaging or other equivalent rotative structures. The rotatable element 23 is made of polyester films, acrylic resin, glass fiber, or any other filmy (light or thin) material.

The rotatable element 23 includes a fixed end and a correspondingly movable end. When rotation speeds of the first heat dissipation apparatus 210 and the second heat dissipation apparatus 220 are different, outlet pressure of the first heat dissipation apparatus 210 and the second heat dissipation apparatus 220 are different, and the movable end of the rotatable element 23 deflects to the first heat dissipation apparatus 210 or the second heat dissipation apparatus 220 according to the pressure difference therebetween such that outlet areas of the first heat dissipation apparatus 210 and the second heat dissipation apparatus 220 are changed. Nevertheless, the overall outlet area of the heat dissipation module 20 is maintained since the area reduced in one of the outlet 211 or the outlet 221 equals the area increased in the other of the outlet 211 and the outlet 221. Further, the heat dissipation apparatus 210/220 with higher rotation speed can have a larger outlet area to improve heat dissipation effect of the heat dissipation module 20.

Figure 2B:
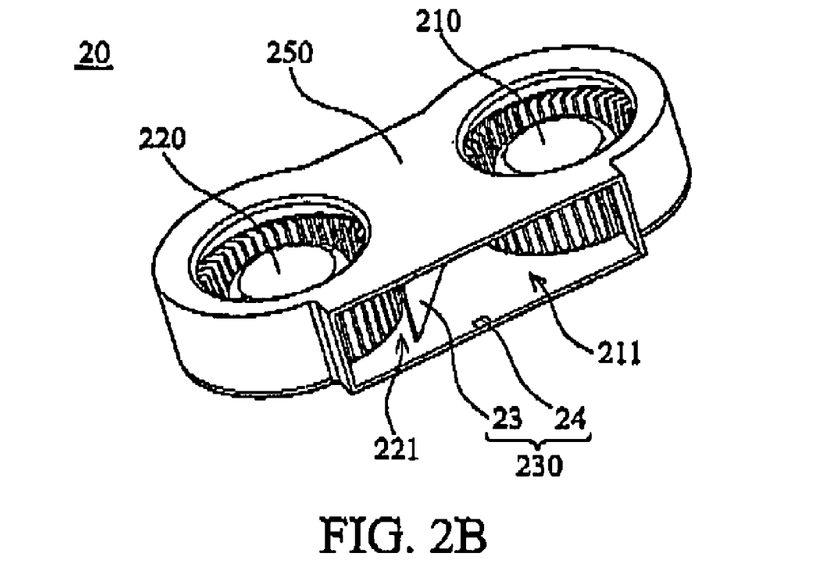
FIG. 2B is a schematic view of a heat dissipation module of an embodiment of the present invention, in which one of the heat dissipation apparatuses malfunctions.

Moreover, when one of the first heat dissipation apparatus 210 and the second heat dissipation apparatus 220 malfunctions, the movable end of the rotatable element 23 deflects to the first heat dissipation apparatus 210 or the second heat dissipation apparatus 220 and changes outlet areas of the first heat dissipation apparatus 210 and the second heat dissipation apparatus 220. That is, the movable end of the rotatable element 23 deflects to seal the outlet 211 or the outlet 221 to prevent backflow to the first heat dissipation apparatus 210 or the second heat dissipation apparatus 220. FIG. 2B shows a heat dissipation module of an embodiment of the present invention, in which one of the heat dissipation apparatuses malfunctions. Referring to FIG. 2B, when the second impeller 220 malfunctions, the movable end of the rotatable element 23 is forced by air flow generated by the first impeller 210 and deflects to the second impeller 220 to seal the second outlet 221. Since the first heat dissipation apparatus 210 is in operation, the rotatable element 23 prevents backflow to the second heat dissipation apparatus 220 while maintaining overall outlet scope of the heat dissipation module 20, That is, the air discharged from the first heat dissipation apparatus 210 not only flows through the outlet 211 but also flows through the area where the outlet 221 locates, so that the overall outlet area maintains substantially the same. In this case, air flow and air pressure provided by the heat dissipation module 20 may be reduced due to the malfunctioning second heat dissipation apparatus 220, but this reduction can be improved by raising the rotation speed of the first heat dissipation apparatus 210, so that high heat dissipation effect of the heat dissipation module 20 can be achieved.

Further, the rotatable elements 23 can be rotatably disposed between the first heat dissipation apparatus 210 and the second heat dissipation apparatus 220. Also, the rotatable element 23 can be a sidewall between the first heat dissipation apparatus 210 and the second heat dissipation apparatus 220. Alternatively, the fixed end of the rotatable element 23 can be directly connected to a sidewall between the first heat dissipation apparatus 210 and the second heat dissipation apparatus 220 as one part of the sidewall.

Furthermore, the flow direction controlling structure 230 may include a limiting element 24 and a flapping element 25. The limiting element 24 is a grille, a guiding bar, a linkage passage, an extrusion block, a frame, a blocking body, a shaft, a pin, or other equivalent elements. When the first heat dissipation apparatus 210 and the second heat dissipation apparatus 220 are in operation, the limiting element 24 can limit the movable end of the rotatable element 23 from deflecting to the first heat dissipation apparatus 210 or the second heat dissipation apparatus 220, as shown in FIG. 2A.

Figure 3:
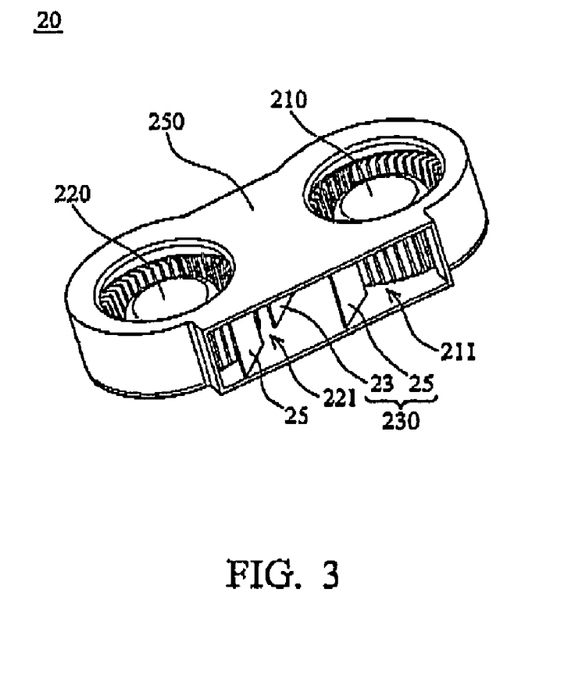
FIG. 3 is a schematic view of another heat dissipation module of an embodiment of the present invention.

FIG. 3 illustrates another heat dissipation module of an embodiment of the present invention. In the embodiment, the first heat dissipation apparatus 210 and the second heat dissipation apparatus 220 are symmetrically disposed and can be sealed by the rotatable element 23. In addition, a flapping element 25 is disposed at the outlet of the first heat dissipation apparatus 210 or the second heat dissipation apparatus 220 to seal the first heat dissipation apparatus 210 or the second heat dissipation apparatus 220 together with the rotatable element 23. The flapping element 25 can be disposed in more than one position, and more than one flapping element 25 can be provided in the heat dissipation module 20.

The invention discloses a heat dissipation module and a flow direction controlling structure, which control air flow and maintain overall outlet scope. Rather than the conventional flappers disposed in relation to respective fans, the rotatable element or the flapper of the present invention are movable in one end and relates to a plurality of fans, which reduces cost in material and manufacture and increases stability of the flow direction controlling structure.

Figure 4:
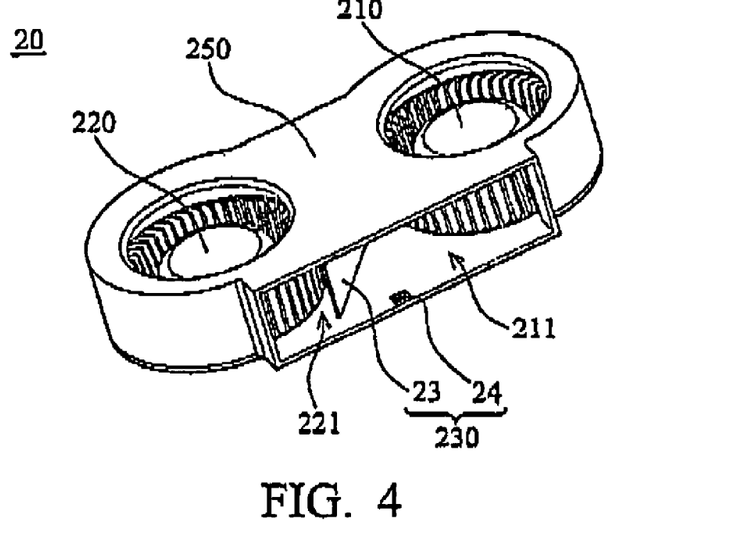
FIG. 4 is a schematic view of a heat dissipation module of an embodiment of the present invention, where the limiting element is a grille.
Figure 5:
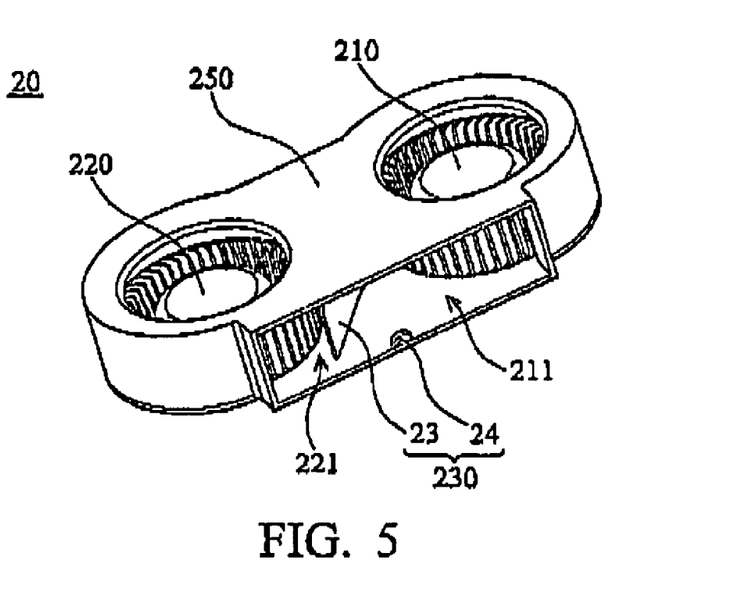
FIG. 5 is a schematic view of a heat dissipation module of an embodiment of the present invention, where the limiting element is a guiding bar.
Figure 6:
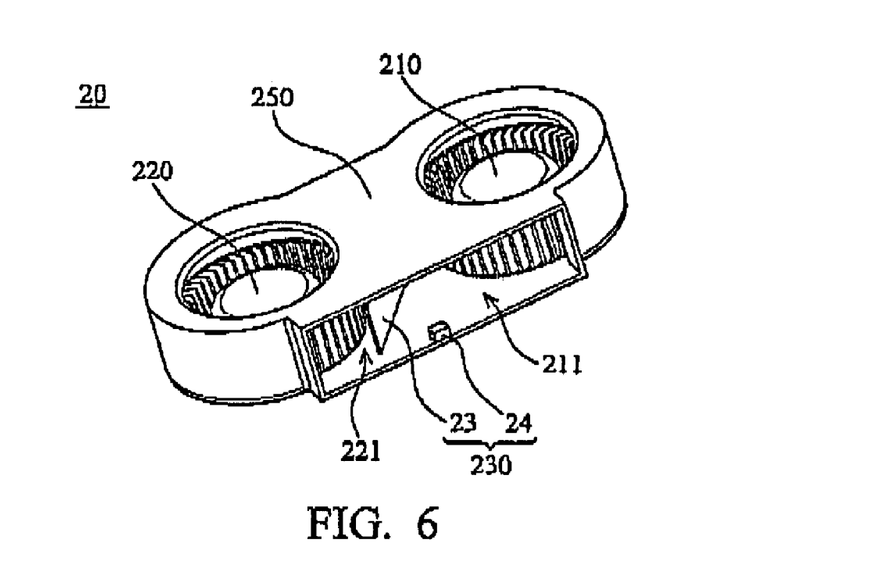
FIG. 6 is a schematic view of a heat dissipation module of an embodiment of the present invention, where the limiting element is an extrusion block or a blocking body.
Figure 7:
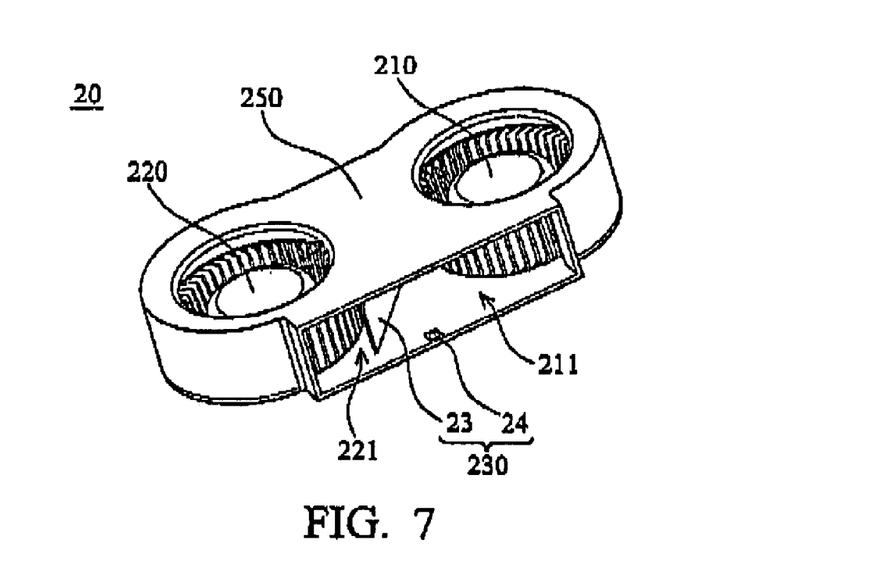
FIG. 7 is a schematic view of a heat dissipation module of an embodiment of the present invention, where the limiting element is a frame.
Figure 8:
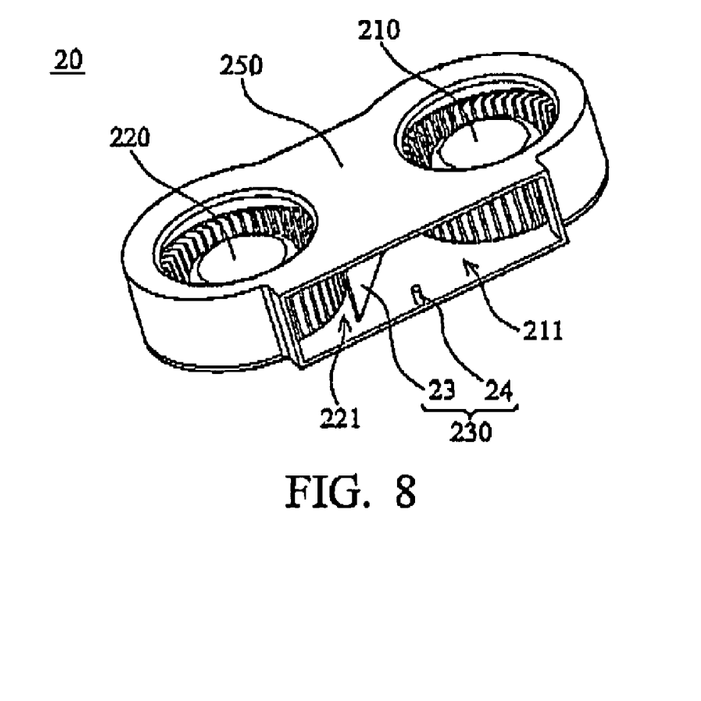
FIG. 8 is a schematic view of a heat dissipation module of an embodiment of the present invention, where the limiting element is a shaft.
Figure 9:
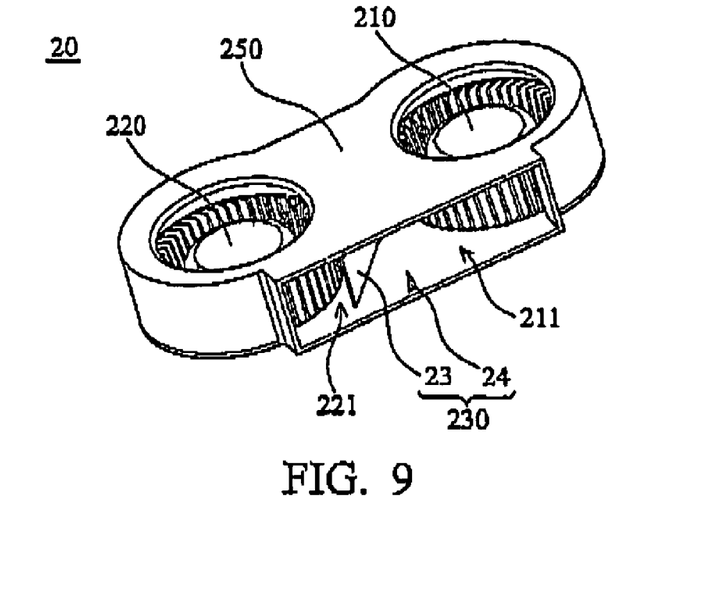
FIG. 9 is a schematic view of a heat dissipation module of an embodiment of the present invention, where the limiting element is a pin.
Figure 10:
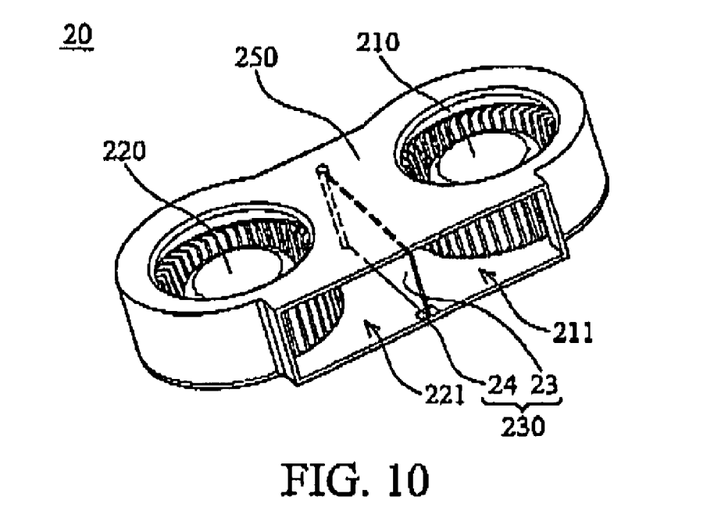
FIG. 10 is a schematic view of a heat dissipation module of an embodiment of the present invention, where the rotatable element is disposed between the first impeller and the second impeller by axial disposal or direct disposal on axis.
Figure 11:
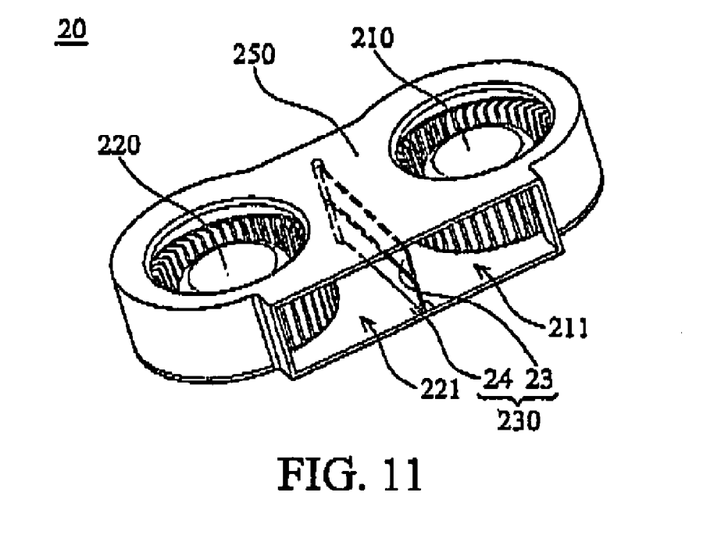
FIG. 11 is a schematic view of a heat dissipation module of an embodiment of the present invention, where the rotatable element is disposed between the first impeller and the second impeller by coaxial disposal or modular disposal.

FIG. 4 shows that the limiting element is a grille. FIG. 5 shows that the limiting element is a guiding bar. FIG. 6 shows that the limiting element is an extrusion block or a blocking body. FIG. 7 shows that the limiting element is a frame. FIG. 8 shows that the limiting element is a shaft. FIG. 9 shows that the limiting element is a pin. FIG. 10 shows that the rotatable element is disposed between the first impeller and the second impeller by axial disposal or direct disposal on axis. FIG. 11 shows that the rotatable element is disposed between the first impeller and the second impeller by coaxial disposal or modular disposal.

While the invention has been described by way of example and in terms of the preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A flow direction controlling structure for a heat dissipation module, the heat dissipation module having a housing with an outlet, a first impeller and a second impeller, both of the first impeller and the second impeller being disposed within the housing, the flow direction controlling structure comprising:

a rotatable element disposed within the housing and between the first impeller and the second impeller so as to divide the outlet into a first outlet and a second outlet, and having a fixed end and a correspondingly movable end; and a limiting element for limiting the movable end of the rotatable element from deflecting to the first impeller or the second impeller when the first impeller and the second impeller are in operation;

wherein when outlet pressure of the first impeller and the second impeller are different, the movable end of the rotatable element deflects to the first impeller or the second impeller to change outlet areas of the first outlet and the second outlet.

2. The flow direction controlling structure as claimed in claim 1, wherein the rotatable element acts as an isolation wall between the first impeller and the second impeller, so that the first impeller and the second impeller respectively have the first outlet and the second outlet.

3. The flow direction controlling structure as claimed in claim 2, wherein when the first impeller malfunctions, the movable end of the rotatable element is forced by air flow generated by the second impeller and deflects to the first impeller to seal the first outlet; or when the second impeller malfunctions, the movable end of the rotatable element is forced by air flow generated by the first impeller and deflects to the second impeller to seal the second outlet.

4. The flow direction controlling structure as claimed in claim 3, further comprising a flapping element disposed at the first outlet to seal the first outlet together with the rotatable element; or the flow direction controlling structure further comprising a flapping element disposed at the second outlet to seal the second outlet together with the rotatable element.

5. The flow direction controlling structure as claimed in claim 1, wherein the limiting element is a grille, a guiding bar, an extrusion block, a frame, a blocking body, a shaft, a pin, or equivalent elements.

6. The flow direction controlling structure as claimed in claim 1, wherein the rotatable element comprises polyester films, acrylic resin, glass fiber, or any other thin material.

7. The flow direction controlling structure as claimed in claim 1, wherein the rotatable element is disposed between the first impeller and the second impeller by axial disposal, coaxial disposal, modular disposal, direct disposal on axis, engagement or other equivalent rotative structures.

8. The flow direction controlling structure as claimed in claim 1, wherein the first impeller and the second impeller are symmetrically disposed.

9. A heat dissipation module, comprising:
a housing having an outlet;
a first impeller;
a second impeller, both of the first impeller and the second impeller being disposed within the housing; and
a flow direction controlling structure having a rotatable element disposed within the housing and between the first impeller and the second impeller so as to divide the outlet into a first outlet and a second outlet; and
a limiting element for limiting the movable end of the rotatable element from deflecting to the first heat dissipation apparatus or the second heat dissipation apparatus when the first heat dissipation apparatus and the second heat dissipation apparatus are in operation;
wherein the rotatable element has a fixed end and a correspondingly movable end, and when outlet pressure of the first impeller and the second impeller are different, the movable end of the rotatable element deflects to the first outlet or the second outlet to change outlet areas of the first outlet and the second outlet.

10. The heat dissipation module as claimed in claim 9, wherein the rotatable element acts as an isolation wall between the first impeller and the second impeller, so that the first impeller and the second impeller respectively have the first outlet and the second outlet.

11. The heat dissipation module as claimed in claim 10, wherein, when the first impeller malfunctions, the movable end of the rotatable element is forced by air flow generated by the second impeller and deflects to the first impeller to seal the first outlet; or when the second impeller malfunctions, the movable end of the rotatable element is forced by air flow generated by the first impeller and deflects to the second impeller to seal the second outlet.

12. The heat dissipation module as claimed in claim 11, further comprising a flapping element disposed at the first outlet to seal the first outlet together with the rotatable element; or the flow direction controlling structure further comprising a flapping element disposed at the second outlet to seal the second outlet together with the rotatable element.

13. The heat dissipation module as claimed in claim 9, wherein the limiting element is a grille, a guiding bar, an extrusion block, a frame, a blocking body, a shaft, a pin, or equivalent elements.

14. The heat dissipation module as claimed in claim 9, wherein the flow direction controlling structure further comprises a flapping element disposed at the first outlet or the second outlet to seal the outlet of the first outlet or the second outlet together with the rotatable element.

15. The heat dissipation module as claimed in claim 9, wherein the rotatable element comprises polyester films, acrylic resin, glass fiber, or any other thin material.

16. The heat dissipation module as claimed in claim 9, wherein the rotatable element is disposed between the first impeller and the second impeller by axial disposal, coaxial disposal, modular disposal, direct disposal on axis, engagement or other equivalent rotative structures.

17. The heat dissipation module as claimed in claim 9, wherein the heat dissipation module is a parallel fan module.

18. The heat dissipation module as claimed in claim 9, wherein the first impeller and the second impeller are symmetrically disposed.

19. A flow direction controlling structure for a heat dissipation module, the heat dissipation module comprising a housing having an outlet, a first impeller and a second impeller, both the first impeller and the second impeller being disposed within the housing, the flow direction controlling structure comprising: a rotatable element disposed within the housing and between the first impeller and the second impeller so as to divide the outlet into a first outlet and a second outlet, and comprising a fixed end and a correspondingly movable end; and a first flapping element disposed at the first outlet to seal the first outlet together with the rotatable element when the outlet pressure of the first impeller is less than the outlet pressure of the second impeller; and a second flapping element disposed at the second outlet to seal the second outlet together with the rotatable element when the outlet pressure of the second impeller is less than the outlet pressure of the first impeller.

20. A heat dissipation module, comprising: a housing having an outlet; a first impeller; a second impeller, both the first impeller and the second impeller being disposed within the housing; and a flow direction controlling structure, comprising a rotatable element disposed within the housing and between the first impeller and the second impeller so as to divide the outlet into a first outlet and a second outlet; and a first flapping element disposed at the first outlet to seal the first outlet together with the rotatable element when the outlet pressure of the first impeller is less than the outlet pressure of the second impeller; and a second flapping element disposed at the second outlet to seal the second outlet together with the rotatable element when the outlet pressure of the second impeller is less than the outlet pressure of the first impeller.

* * * * *